(12) United States Patent
Kim et al.

(10) Patent No.: US 9,978,472 B2
(45) Date of Patent: May 22, 2018

(54) TRANSPARENT CONDUCTOR AND OPTICAL DISPLAY INCLUDING THE SAME

(71) Applicant: SAMSUNG SDI CO., LTD., Yongin-si, Gyeonggi-do (KR)

(72) Inventors: Do Young Kim, Uiwang-si (KR); Young Kwon Koo, Uiwang-si (KR); Dong Myeong Shin, Uiwang-si (KR); Hyoung Tae Lim, Uiwang-si (KR); Oh Hyeon Hwang, Uiwang-si (KR); Kyoung Ku Kang, Uiwang-si (KR)

(73) Assignee: Samsung SDI Co., Ltd., Yongin-si, Gyeonggi-do (KR)

( * ) Notice: Subject to any disclaimer, the term of this patent is extended or adjusted under 35 U.S.C. 154(b) by 294 days.

(21) Appl. No.: 14/638,730

(22) Filed: Mar. 4, 2015

(65) Prior Publication Data
US 2015/0255183 A1  Sep. 10, 2015

(30) Foreign Application Priority Data
Mar. 5, 2014 (KR) .................. 10-2014-0026277

(51) Int. Cl.
| | | |
|---|---|---|
| *H01B 1/22* | (2006.01) | |
| *H01L 31/0224* | (2006.01) | |
| *H01L 51/54* | (2006.01) | |
| *H01B 1/02* | (2006.01) | |
| *H01L 51/52* | (2006.01) | |

(52) U.S. Cl.
CPC ........... *H01B 1/02* (2013.01); *H01L 51/5206* (2013.01); *H01L 51/5275* (2013.01); *H01B 1/22* (2013.01); *H01L 31/022466* (2013.01); *H01L 31/022491* (2013.01); *H01L 2251/5369* (2013.01); *Y10T 428/249969* (2015.04); *Y10T 428/265* (2015.01); *Y10T 428/31678* (2015.04)

(58) Field of Classification Search
CPC ......... C09D 5/006; H01L 31/0224–31/022491
See application file for complete search history.

(56) References Cited

U.S. PATENT DOCUMENTS

| | | | | |
|---|---|---|---|---|
| 5,591,517 A | * | 1/1997 | Takamiya | B60K 37/00 428/304.4 |
| 6,091,184 A | * | 7/2000 | De Vries | G02F 1/133502 313/110 |
| 2004/0017364 A1 | * | 1/2004 | Tanaka | G02F 1/13338 345/173 |
| 2007/0074316 A1 | * | 3/2007 | Alden | B82Y 30/00 257/784 |

FOREIGN PATENT DOCUMENTS

| | | | |
|---|---|---|---|
| KR | 10-2009-0023044 | * | 3/2009 |
| KR | 10-2014-0025230 | * | 3/2012 |
| KR | 10-2012-0053724 A | | 5/2012 |

OTHER PUBLICATIONS

Korean Office Action dated Jul. 19, 2016 (Year: 2016).*

* cited by examiner

*Primary Examiner* — Ramsey E Zacharia
(74) *Attorney, Agent, or Firm* — Lee & Morse, P.C.

(57) ABSTRACT

A transparent conductor and an optical display including the same are disclosed. The transparent conductor includes a base layer, and a transparent conductive layer formed on the base layer and including metal nanowires. The transparent conductor has a total diffuse reflection (DR) of greater than or equal to about 80% and less than 330% at a wavelength of about 380 nm to about 780 nm and a reflective b* value from about −2 to about 1 at a wavelength of about 380 nm to about 780 nm.

13 Claims, 5 Drawing Sheets

TRANSPARENT CONDUCTOR AND OPTICAL DISPLAY INCLUDING THE SAME

CROSS-REFERENCE TO RELATED APPLICATION

Korean Patent Application No. 10-2014-0026277, filed on Mar. 5, 2014, in the Korea Intellectual Property Office, and entitled: "Transparent Conductor and Optical Display Comprising the Same," is incorporated by reference herein in its entirety.

BACKGROUND

1. Field

Embodiments relate to a transparent conductor and an optical display including the same.

2. Description of the Related Art

A transparent conductor may be used for, e.g., touch-screen panels included in displays, flexible displays and the like.

SUMMARY

Embodiments are directed to a transparent conductor, including a base layer, and a transparent conductive layer on the base layer, the transparent conductive layer including metal nanowires and having a total diffuse reflection (DR) of greater than or equal to about 80% and less than 330% at a wavelength of about 380 nm to about 780 nm and a reflective b* value from about −2 to about 1 at a wavelength of about 380 nm to about 780 nm.

The metal nanowires may include silver nanowires.

The transparent conductor may include the base layer, a high refractive index coating layer on the base layer, the transparent conductive layer on the high refractive index coating layer, and a low refractive index coating layer on the transparent conductive layer.

The high refractive index coating layer may have an index of refraction of about 1.7 to about 1.9.

The high refractive index coating layer may have a thickness of about 40 nm to about 100 nm.

The high refractive index coating layer may include titanium oxide, zirconium oxide, silicon oxide, or a combination thereof.

The low refractive index coating layer may have an index of refraction of about 1.3 to about 1.38.

The low refractive index coating layer may have a thickness of about 50 nm to about 150 nm.

The low refractive index coating layer may include inorganic particles having an index of refraction of about 1.30 to about 1.38 and a dye.

The inorganic particles may include hollow silica particles, porous silica particles, or a combination thereof.

The dye may include an anthraquinone dye.

The transparent conductive layer may have a thickness of about 100 nm to about 150 nm.

The transparent conductor may have a transmittance x value of about 0.3 to about 0.4 and a transmittance y value of about 0.3 to about 0.4 at a wavelength of about 380 nm to about 780 nm.

Embodiments are also directed to an optical display including a transparent conductor according to an embodiment.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
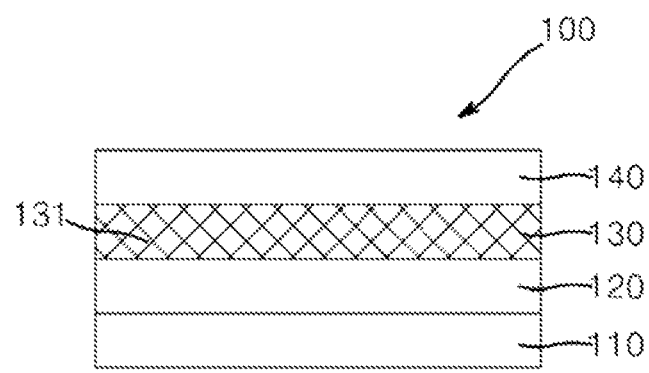
FIG. 1 illustrates a sectional view of a transparent conductor according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

As used herein, spatially relative terms such as "upper" and "lower" are defined with reference to the accompanying drawings. Thus, it will be understood that "upper" can be used interchangeably with "lower". It will be understood that when a layer is referred to as being "on" another layer (or region), it can be directly formed on the other layer or region, or intervening layer(s) (region(s)) may also be present. Thus, it will be understood that when a layer is referred to as being "directly on" another layer (or region), no intervening layer (region) is interposed therebetween. The term "(meth)acrylate" may refer to acrylates and/or methacrylates.

Hereinafter, a transparent conductor according to an example embodiment will be described in detail with reference to FIG. 1. FIG. 1 is a sectional view of a transparent conductor according to an example embodiment.

Referring to FIG. 1, a transparent conductor 100 according to an example embodiment includes a base layer 110, a high refractive index coating layer 120 formed on the base layer 110, a transparent conductive layer 130 formed on the high refractive index coating layer 120 and including metal nanowires 131, and a low refractive index coating layer 140 formed on the transparent conductive layer 130. The transparent conductor 100 has a total diffuse reflectance of greater than or equal to about 80% and less than 330% at a wavelength of about 380 nm to about 780 nm and a reflective b* value from about −2 to about 1 (inclusive). According to this embodiment, with a total diffuse reflectance of greater than or equal to about 80% and less than 330% and a reflective b* value of about −2 to about 1 (inclusive), the transparent conductor 100 may reduce scattering of light due to the metal nanowires 131 and a color value of the transparent conductive layer 130, which may reduce or eliminate pattern visibility.

As used herein, the term "total diffuse reflectance" means a total diffuse reflectance in a specific wavelength range. The total diffuse reflectance may be a total diffuse reflectance at a wavelength of about 380 nm to about 780 nm in a graph depicting a relationship between diffuse reflectance and wavelength, as measured upon irradiation of the transparent conductor 100 with light in the overall wavelength range. Diffuse reflectance varies depending upon the wavelength of light, regardless of the thickness of the transparent conductor 100. For example, the total diffuse reflectance may be measured on the transparent conductor 100 having a thickness of about 50 μm to about 150 μm.

The transparent conductor 100 may have a reflective b* value from about −2 to about 1 (inclusive). If the reflective b* value is less than about −2, a conductive film may look blue, and if the reflective b* value exceeds about 1, a pattern may be visible due to the metal nanowires 131. Although the reflective b* value can be measured on the transparent conductor 100 at room temperature and at a wavelength of about 380 nm to about 780 nm using a colorimeter (CM3600D, CIE Lab., Konica Minolta Co., Ltd.) in accordance with DIN5033 Tei7, JIS Z 8722 (Condition c), ISO772411, CIE No. 15, or ASTM E1164, the reflective b* value may fall within the range according to the present example embodiment even though the material and the thickness of the base layer 110, the thickness of the conductive layer 130 (about 100 nm to about 150 nm), or the wavelength are changed.

The transparent conductor 100 may have a transmittance x value of about 0.3 to about 0.4 and a transmittance y value of about 0.3 to about 0.4 at a wavelength of about 380 nm to about 780 nm. Within this range, the transparent conductor 100 may maintain an inherent color. That is, the transparent conductor 100 according to this embodiment may reduce or eliminate pattern visibility resulting from reduction of the reflective b* value while maintaining the inherent color by significantly reducing the reflective b* value.

The base layer 110 may be a transparent film that has a total transmittance from about 85% to about 100% (inclusive) at a wavelength of 550 nm, and may have an index of refraction from about 1.50 to about 1.70. Within this range, the transparent conductor 100 may exhibit improved optical properties with little or no pattern visibility.

The base layer 110 may include polyester films including polycarbonates, cyclic olefin polymers, polyester resins including polyethylene terephthalate (PET), polyethylene naphthalate and the like, polyolefin films, polysulfone films, polyimide films, silicone films, polystyrene films, polyacrylic films, and polyvinyl chloride films, etc. The base layer 110 may have a structure in which at least two resin films are stacked via adhesives and the like.

The base layer 110 may have a thickness of about 10 μm to about 200 μm, e.g., about 50 μm to about 150 μm. Within this range, the base layer may be used for displays.

The transparent conductor 100 may further include a functional layer stacked on one or both surfaces of the base layer 110. The functional layer may include a hard coating layer, an anticorrosion layer, an anti-glare coating layer, an adhesion promoting layer, and an oligomer elution preventing layer, etc.

The high refractive index coating layer 120 may be formed on the base layer 110. The high refractive index coating layer 120 has a higher index of refraction than either the transparent conductive layer 130 or the low refractive index coating layer 140, which may reduce diffuse reflectance and pattern visibility upon irradiation of the transparent conductor 100. For example, the high refractive index coating layer 120 may have an index of refraction of about 1.7 to about 1.9, or about 1.8 to about 1.9. Within this range, the high refractive index coating layer 120 may reduce or eliminate pattern visibility and allow a reduction in reflection by the low refractive index coating layer 140. The high refractive index coating layer 120 may have a thickness of about 40 nm to about 100 nm, e.g., about 40 nm to about 80 nm. Within this range, the high refractive index coating layer may reduce or eliminate pattern visibility, may be used in the transparent conductor 100, and may allow reduction in reflection by the low refractive index coating layer 140.

The high refractive index coating layer 120 may include high refractive index particles in order to secure a high index of refraction, and the high refractive index particles may include organic particles, inorganic particles, or mixtures thereof. For example, the high refractive index particles may have an index of refraction of about 2.0 or less, e.g., about 1.7 to about 1.9. Within this range, it may be possible to reduce or eliminate pattern visibility while allowing reduction in reflection by the low refractive index coating layer 140.

For example, the high refractive index particles may include oxides of metal, nonmetal, metalloid, and the like, e.g., at least one of titanium oxide, zirconium oxide, and silicon oxide. The high refractive index particles may have an average particle diameter of about 20 nm to about 50 nm. Within this range, the high refractive index particles may provide improved effects in terms of coatability, dispersion stability, and reducing reflectance by the low refractive index coating layer 140.

The high refractive index coating layer 120 may be composed of the high refractive index particles alone. In another implementation, the high refractive index coating layer 120 may be formed of a composition that includes the high refractive index particles and a resin and/or a monomer in order to maintain physical properties of the transparent conductor 100 and adhesion between the base layer 110 and the transparent conductive layer 130. For example, the resin and/or the monomer may be a suitable resin and/or monomer that has an index of refraction not disturbing high refractivity of the high refractive index particles. For example, the resin and/or the monomer may have an index of refraction of about 1.45 to about 1.55, or about 1.50 to about 1.52. The resin and/or the monomer may include (meth)acrylate compounds, etc.

The transparent conductive layer 130 may be formed on the high refractive index coating layer 120. The transparent conductive layer 130 may include a conductive network of the metal nanowires 131, which may secure conductivity, good flexibility, and bendability. As a result, the transparent conductive layer 130 may form electrodes through a patterning process such as etching and the like, and may be used in a flexible device.

The metal nanowires 131 have an ultrafine wire shape having a specific cross-section. In some embodiments, a ratio of length (L) to cross-sectional diameter (d) of the metal nanowires 131 (L/d, aspect ratio) may range from about 10 to about 2,000. Within this range, the metal nanowires may realize a highly conductive network even at a low concentration of the metal nanowires, and may exhibit reduced sheet resistance. For example, the metal nanowires may have an aspect ratio of about 500 to about 1,000, for example, about 500 to about 700.

The metal nanowires may have a cross-sectional diameter (d) of greater than 0 nm to about 100 nm. Within this range, a transparent conductor 100 exhibiting high conductivity and low sheet resistance may be realized by securing a high L/d. For example, the metal nanowires may have a cross-sectional diameter (d) of about 30 nm to about 100 nm, for example, about 60 nm to about 100 nm. The metal nanowires may have a length (L) of about 20 μm or more, for example, about 20 μm to about 50 μm. Within this range, a conductive film exhibiting high conductivity and low sheet resistance may be realized by securing a high aspect ratio (L/d).

The metal nanowires 131 may include nanowires formed of a suitable metal. For example, the metal nanowires may include silver nanowires, copper nanowires, gold nanowires, a mixtures thereof, etc. In one embodiment, the metal nanowires may be silver nanowires or a mixture including the silver nanowires.

The metal nanowires 131 may be present in an amount of about 13% by weight (wt %) or more, for example, about 13 wt % to about 100 wt %, for example, about 13 wt % to about 23 wt %, in the transparent conductive layer 130. Within this range, the metal nanowires may secure sufficient conductivity and may form the conductive network.

The transparent conductive layer 130 may further include a matrix in addition to the metal nanowires 131. The matrix may be a resin into which the network of the metal nanowires 131 is impregnated. The matrix may improve adhesion of the transparent conductive layer 130 to the base layer 110 and chemical resistance of the transparent conductive layer 130, and may prevent oxidation of the metal nanowires 131 by preventing exposure of the metal nanowires 131. For example, the transparent conductive layer 130 may be composed of about 13 wt % to about 23 wt % of the metal nanowires 131 and about 77 wt % to about 87 wt % of the matrix. Within this range, the transparent conductive layer may secure conductivity and adhesion to the base layer 110.

The matrix may be formed of a matrix composition including a binder and an initiator. The binder may include at least one of monofunctional or polyfunctional (meth)acrylate monomers, etc. The matrix may further include additives such as a thickening agent, a dispersant, and the like. The dispersant may improve dispersion of the metal nanowires and the binder, and the thickening agent may improve viscosity of the composition such that the transparent conductive layer 130 may be formed.

The transparent conductive layer may have a thickness of about 10 nm to about 1 μm, for example about 50 nm to about 500 nm, about 100 nm to about 200 nm, or about 100 nm to about 150 nm. Within this thickness range of the transparent conductive layer, the transparent conductor 100 may be applied to films for touch panels, and may facilitate thickness control of the high refractive index coating layer 120 and the low refractive index coating layer 140.

The low refractive index coating layer 140 may be formed on the transparent conductive layer 130. The low refractive index coating layer 140 has a lower index of refraction than either the transparent conductive layer 130 or the high refractive index coating layer 120, which may help reduce diffuse reflectance and pattern visibility upon irradiation of the transparent conductor 100. For example, the low refractive index coating layer 140 may have an index of refraction of about 1.3 to about 1.38, or about 1.33 to about 1.35. Within this range, the low refractive index coating layer 140 may reduce or eliminate pattern visibility while securing low reflectance and reduction in milkiness. In addition, the low refractive index coating layer 140 may have a thickness of about 50 nm to about 150 nm, or about 50 nm to about 90 nm. Within this range, the low refractive index coating layer 140 may reduce or eliminate pattern visibility and may be used in the transparent conductor 100 while securing low reflectance and reduction in milkiness.

The low refractive index coating layer 140 formed on the transparent conductive layer 130 may act as an overcoating layer, which may prevent oxidation of the metal nanowires 131 in the transparent conductive layer 130 while improving adhesion between the transparent conductive layer 130 and the high refractive index coating layer 120.

The low refractive index coating layer 140 may have suitable components in view of the index of refraction of the low refractive index coating layer 140 being within the aforementioned range.

In an example embodiment, the low refractive index coating layer 140 may be formed by curing a resin and/or a monomer having a low index of refraction. For example, the resin and/or the monomer having a low index of refraction may include a fluorine-containing (meth)acrylate monomer or a resin comprising the same.

In an example embodiment, the low refractive index coating layer 140 may be formed by curing a composition including low refractive inorganic particles, a UV curable monomer and/or an oligomer thereof. For example, the low refractive inorganic particles may be particles having an index of refraction of about 1.3 to about 1.38, for example, about 1.32 to about 1.35. The low refractive inorganic particles may include hollow silica particles, porous silica particles, or mixtures thereof.

The low refractive inorganic particles may be optionally present, e.g., in an amount of about 0 wt % to about 10 wt %, or about 0.01 wt % to about 10 wt %, in the low refractive index coating layer 140. Within this range, the low refractive inorganic particles may provide an effect of reducing reflectance. The low refractive inorganic particles may have an average particle size of about 30 nm to about 100 nm. Within this range, the low refractive inorganic particles may provide an effect of reducing reflectance. For example, the UV curable monomer and/or the oligomer thereof may include a (meth)acrylate monomer and/or an oligomer thereof, a fluorine (meth)acrylate monomer and/or an oligomer thereof, and mixtures thereof.

The low refractive index coating layer 140 may further include a dye and/or a pigment to achieve further reduction in diffuse reflectance and the reflective b* value such that the transparent conductive layer 130 may look transparent and may reduce or eliminate pattern visibility through suppression of the milkiness phenomenon. The dye may be included in the transparent conductive layer 130. However, the dye included in the transparent conductive layer 130 may obstruct electrical conduction between the metal nanowires 131, which may increase sheet resistance.

The dye may include a mixture of a first dye having a maximum absorption wavelength of about 450 nm to about 550 nm and a second dye having a maximum absorption wavelength of about 350 nm to about 449 nm. Use of the mixture of the first and second dyes may enhance pattern visibility-blocking effects, as compared with use of the first or second dye alone.

The mixture of the first and second dyes may be present in an amount of about 0.1 wt % to about 8 wt %, for example about 0.1 wt % to about 6 wt %, in the low refractive index coating layer 140. Within this range, the mixture of the first and second dyes may secure the pattern visibility-blocking effects, and may maintain adhesion of the low refractive index coating layer 140 to the transparent conductive layer 130.

The first and second dyes may be selected from suitable that have maximum absorption wavelengths within the range as set forth above. The first and second dyes may have a liquid or solid form, and may include anthraquinone, acridine, diarylmethane, triarylmethane, azo, diazonium, quinone, rhodamine, and fluorene chromophores, etc. The first dye may be Y-300 (anthraquinone dye, Yabang Co., Ltd., China) and the second dye may be Y-82 (anthraquinone dye, Yabang Co., Ltd., China), etc. In one embodiment, a weight ratio of the first dye to the second dye may range from about 1:0.1 to about 1:10, e.g., from 1:0.5 to about 1:3. Within this range, the transparent conductor may have the pattern visibility-blocking effects.

In order to improve performance of the low refractive index coating layer 140, the low refractive index coating layer 140 may further include additives, such as an adhesion promoter, an antioxidant, and the like, at levels that do not influence the low index of refraction of the low refractive index coating layer.

The transparent conductor 100 may exhibit transparency in a visible light range, for example, at a wavelength of about 400 nm to about 700 nm. In one embodiment, the transparent conductor 100 may have a haze of about 0% to about 1.4%, e.g., about 0.01% to about 1.4%, as measured at a wavelength of about 400 nm to about 700 nm using a haze meter, and a total transmittance from about 85% to about 100% (inclusive), for example, from about 90% to about 95% (inclusive). Within this range, the transparent conductor may have good transparency.

The transparent conductor 100 may have a sheet resistance of about 100Ω/□ or less, e.g., about 50Ω/□ to about 100Ω/□, or about 60Ω/□ to about 70Ω/□, as measured using a 4-probe tester. Within this range, the transparent conductor may be used as an electrode film for touch panels due to low sheet resistance and may be applied to large-area touch panels.

The transparent conductor 100 may have a thickness of about 10 μm to about 250 μm, e.g., about 50 μm to about 150 μm, etc. Within this range, the transparent conductor may be used as a transparent electrode film including a film for touch panels, and may be used as a transparent electrode film for flexible touch panels. The transparent conductor may be used in film form as a transparent electrode film of touch panels, e-paper, and solar cells.

The transparent conductor 100 may be manufactured by a general method. For example, a composition for a high refractive index coating layer may be coated onto at least one surface of the base layer 110, followed by drying and curing to form the high refractive index coating layer 120. Then, a composition for a transparent conductive layer may be coated onto the high refractive index coating layer 120 and dried to form the transparent conductive layer 130, and then a composition for a low refractive index coating layer may be coated onto the transparent conductive layer 130, followed by drying and curing the composition to form the low refractive index coating layer. The dying may be performed in an oven at about 60° C. to about 100° C. for about 1 minute to about 30 minutes, and curing may be performed by UV irradiation at about 300 mJ/cm² to about 1000 mJ/cm².

The transparent conductor according to the present example embodiment may further include at least one of the high refractive index coating layer 120, the transparent conductive layer 130, and the low refractive index coating layer 140 on a lower surface of the base layer 110.

Figure 2:
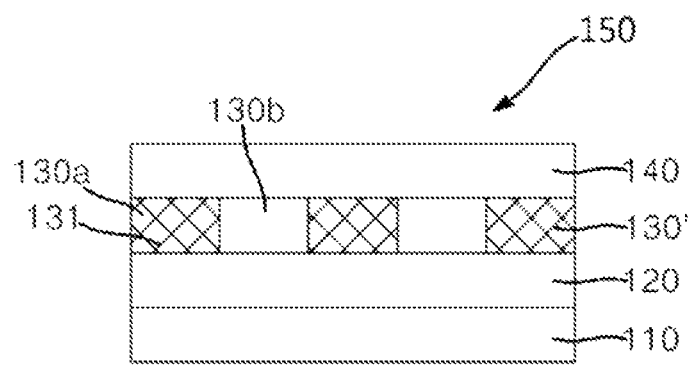
FIG. 2 illustrates a sectional view of a transparent conductor according to an example embodiment.

Hereinafter, a transparent conductor according to an example embodiment will be described in detail with reference to FIG. 2. FIG. 2 is a sectional view of a transparent conductor according to an example embodiment.

Referring to FIG. 2, a transparent conductor 150 according to an example embodiment includes a base layer 110, a high refractive index coating layer 120 formed on an upper surface of the base layer 110, a transparent conductive layer 130' formed on an upper surface of the high refractive index coating layer 120 and having a pattern of a metal nanowire-containing conductive layer 130a, which includes metal nanowires 131, and a metal nanowire-free conductive layer 130b, which does not include the metal nanowires 131, and a low refractive index coating layer 140 formed on an upper surface of the transparent conductive layer 130'. The transparent conductor 150 has a total diffuse reflectance of greater than or equal to about 80% and less than 330% at a wavelength of about 380 nm to about 780 nm, and a reflective b* value from about −2 to about 1 (inclusive). Thus, the transparent conductor 150 according to this embodiment is substantially the same as the transparent conductor 100 according to the first embodiment except that the transparent conductive layer 130' is a patterned transparent conductive layer.

Patterning may be performed by a general method. For example, a photoresist layer may be formed on the low refractive index coating layer 140 and a mask having a predetermined pattern may be placed on the photoresist layer, followed by UV exposure, development, baking and etching, thereby forming the transparent conductive layer 130'. By patterning, the transparent conductor 150 may be used as a transparent electrode film.

The transparent conductor according to the present example embodiment may further include at least one of the high refractive index coating layer 120, the transparent conductive layer 130', and the low refractive index coating layer 140 on a lower surface of the base layer 110.

An apparatus according to an example embodiment includes the transparent conductor according to one or more embodiments. For example, the apparatus may include optical displays such as touch panels, touchscreen panels, flexible displays, and the like; e-paper; and solar cells, etc.

An optical display according to embodiments may include a display unit, a transparent electrode structure formed on the display unit, and a window layer formed on the transparent conductor. The display unit may include an LCD panel, an OLED panel or an LED panel. When the display unit includes an OLED panel, an encapsulation layer may be further formed on the OLED panel to block moisture and/or oxygen. The transparent conductor may include a transparent conductor according to embodiments. The window layer performs a screen display function in the optical display and may be formed of a suitable glass material or a transparent plastic film. In one embodiment, the optical display may further include an adhesive film between the display unit and the transparent electrode body structure and/or between the transparent electrode structure and the window layer.

The optical display according to the present example embodiment may include a touchscreen panel including the transparent electrode structure. The touchscreen panel generates electrical signals through detection of variation in capacitance when a human body or a conductor such as a stylus touches the touchscreen panel, and the drive unit may be driven by such electrical signals. The optical display according to an embodiment may be an add-on type optical display in which the touchscreen panel is disposed on the display panel, or may be an integrated type optical display in which the touchscreen panel is disposed inside the display panel. The integrated type optical display includes an on-cell type optical display and an in-cell type optical display. In the on-cell type optical display, the touchscreen panel is formed on an upper surface of an upper substrate of the display panel, and in the in-cell type optical display, the touchscreen panel is formed on a lower surface of the upper substrate of the display panel.

FIG. 3 to FIG. 10 are sectional views of optical displays according to embodiments.

Figure 3:
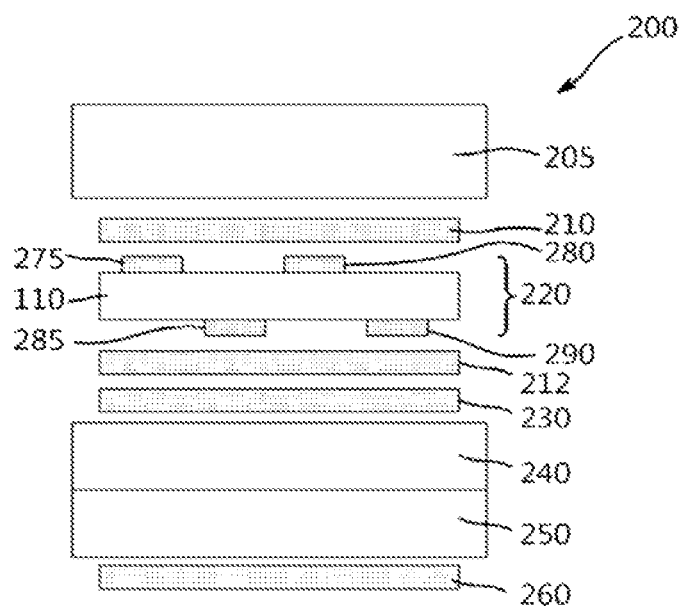
FIG. 3 illustrates a sectional view of an optical display according to an example embodiment.

Referring to FIG. 3, an optical display 200 according to an example embodiment may include: a transparent electrode structure 220 including a base layer 110, first and second electrodes 275, 280 formed on an upper surface of the base layer 110, and third and fourth electrodes 285, 290 formed on a lower surface of the base layer 110; a window layer 205 placed above the first and second electrodes 275, 280; a first polarizing plate 230 placed below the third and fourth electrodes 285, 290; an upper substrate 240 formed on a lower surface of the first polarizing plate 230; a display unit 250 formed on a lower surface of the upper substrate 240; and a second polarizing plate 260 formed on a lower surface of the display unit 250. Here, the transparent electrode structure 220 may be formed using the transparent conductor according to an embodiment.

The transparent electrode structure 220 may be manufactured by forming the first, second, third and fourth electrodes by patterning the transparent conductor according to the embodiments using a predetermined method (for example, etching and the like). The first and second electrodes 275, 280 may be Rx electrodes, and the third and fourth electrodes 285, 290 may be Tx electrodes, or vice versa.

The window layer 205 performs a screen display function in the optical display and may be formed of a general glass material or a transparent plastic material.

The first and second polarizing plates 230, 260 serve to impart polarization capabilities to the optical display and may polarize external or internal light. In addition, each of the first and second polarizing plates 230, 260 may include a polarizer or a stacked body of a polarizer and a protective film, and the polarizer and the protective film may include general polarizers and protective films known in the art, respectively.

The upper substrate 240 is placed on the upper surface of the display unit 250 and may be a color filter (CF) glass substrate, an encapsulation glass substrate, or the like.

The display unit 250 may include an optical device including a thin film transistor and an LCD, an OLED, or an LED.

Adhesive films 210, 212 may be interposed between the window layer 205 and the transparent electrode structure 220 and between the transparent electrode structure 220 and the first polarizing plate 230, respectively, thereby maintaining bonding between the transparent electrode structure 220, the window layer 205 and the first polarizing plate 230. The adhesive films 210, 212 may be general adhesive films and may include, for example, optically clear adhesive (OCA) films.

Figure 4:
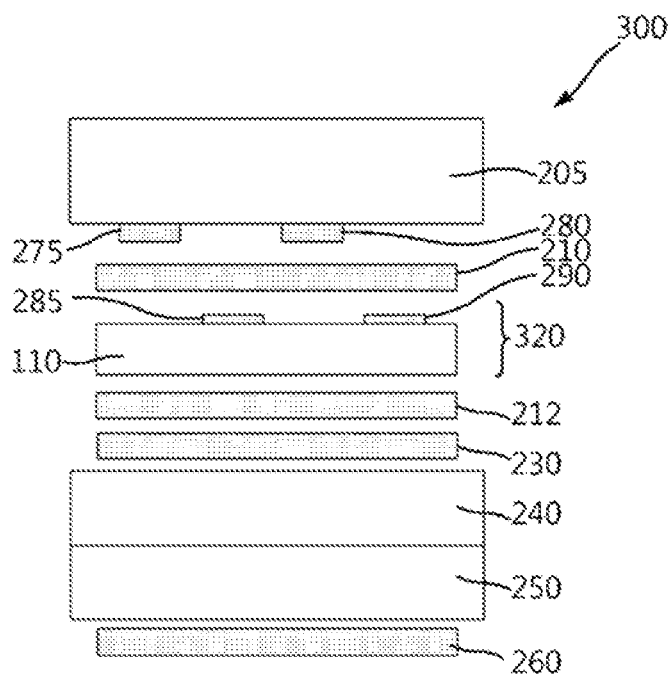
FIG. 4 illustrates a sectional view of an optical display according to an example embodiment.

Referring to FIG. 4, an optical display 300 according to an example embodiment may include: a transparent electrode structure 320 including a base layer 110 and third and fourth electrodes 285, 290 formed on an upper surface of the base layer 110; a window layer 205 placed above the third and fourth electrodes 285, 290 and including first and second electrodes 275, 280 formed on a lower surface thereof; a first polarizing plate 230 placed below the transparent electrode structure 320; an upper substrate 240 formed on a lower surface of the first polarizing plate 230; a display unit 250 formed on a lower surface of the upper substrate 240; and a second polarizing plate 260 formed on a lower surface of the display unit 250. Here, the transparent electrode structure 320 may be formed using the transparent conductor according to an embodiment.

The transparent electrode structure 320 may be manufactured by patterning the transparent conductor according to the embodiments to form the third and fourth electrodes 285, 290. The first and second electrodes 275, 280 may be formed by a general electrode formation method.

Adhesive films 210, 212 may be interposed between the window layer 205 and the transparent electrode structure 320 and between the transparent electrode structure 320 and the first polarizing plate 230, respectively, thereby maintaining bonding between the transparent electrode structure 320, the window layer 205 and the first polarizing plate 230.

Figure 5:
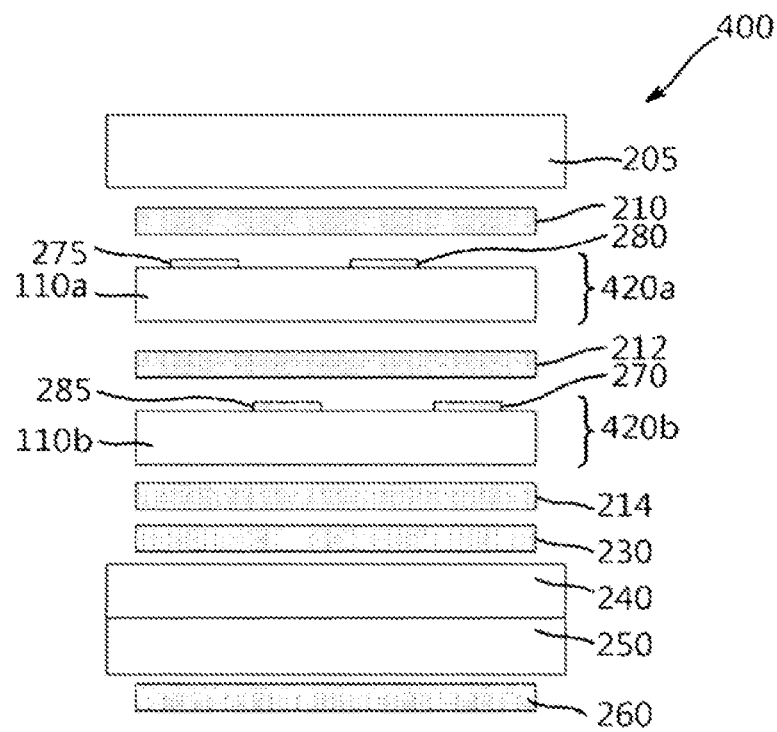
FIG. 5 illustrates a sectional view of an optical display according to an example embodiment.

Referring to FIG. 5, an optical display 400 according to an example embodiment may include: a first transparent electrode structure 420a including a first base layer 110a and first and second electrodes 275, 280 formed on an upper surface of the first base layer 110a; a second transparent electrode structure 420b placed below the first transparent electrode structure 420a, and including a second base layer 110b and third and fourth electrodes 285, 290 formed on an upper surface of the second base layer 110b; a first polarizing plate 230 placed below the second transparent electrode structure 420b; an upper substrate 240 formed on a lower surface of the first polarizing plate 230; a display unit 250 formed on a lower surface of the upper substrate 240; and a second polarizing plate 260 formed on a lower surface of the display unit 250. Here, the first and second transparent electrode structures 420a, 420b may be formed using the transparent conductors according to embodiments.

The first and second transparent electrode structures 420a, 420b may be formed by patterning the transparent conductors according to the embodiments to form the first, second, third and fourth electrodes.

Adhesive films 210, 212, 214 may be interposed between the first transparent electrode structure 420a and the window layer 205, between the first transparent electrode structure 420a and the second transparent electrode structure 420b, and between the second transparent electrode structure 420b and the first polarizing plate 230, respectively, thereby maintaining bonding between the transparent electrode structures, the window layer and the first polarizing plate. The adhesive films 210, 212, 214 may be general adhesive films and may include, for example, optically clear adhesive (OCA) films.

Figure 6:
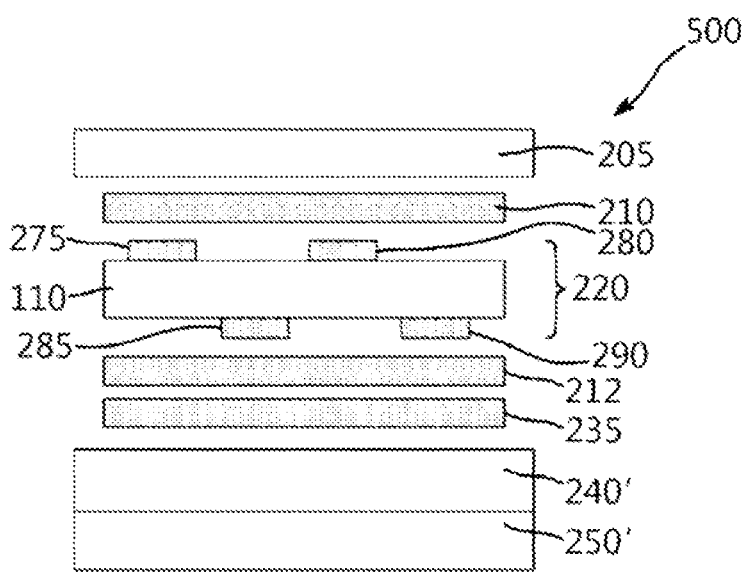
FIG. 6 illustrates a sectional view of an optical display according to an example embodiment.

Referring to FIG. 6, an optical display 500 according to an example embodiment may include: a transparent electrode structure 220 including a base layer 110, first and second electrodes 275, 280 formed on an upper surface of the base layer 110, and third and fourth electrodes 285, 290 formed on a lower surface of the base layer 110; a window layer 205 placed above the first and second electrodes 275, 280; a polarizing plate 235 placed below the third and fourth electrodes 285, 290; an upper substrate 240' placed below the polarizing plate 235; and a display unit 250' formed on a lower surface of the upper substrate 240. Here, the transparent electrode structure 220 may be formed using the transparent conductor according to embodiments.

The transparent electrode structure 220 may be manufactured by patterning the transparent conductor according to the embodiments to form the first, second, third and fourth electrodes. The first and second electrodes 275, 280 may be Rx electrodes, and the third and fourth electrodes 285, 290 may be Tx electrodes, or vice versa.

The display unit 250' may include an optical device including a thin film transistor and an LCD, an OLED, or an LED. In some embodiments, the display unit 250 may include a lower substrate, a thin film transistor, organic light emitting diodes, a planarizing layer, a protective layer, an insulating layer, and a bonding layer.

The upper substrate 240' protects the organic light emitting diodes and the thin film transistor, and may be formed on the adhesive layer. The upper substrate 240' may be formed of the same or different material from that of the lower substrate. For example, the upper substrate 240' may include a flexible substrate such as a silicon substrate, a polyimide substrate, a polycarbonate substrate, and a polyacrylate substrate, etc.

The lower substrate supports the display unit 250' and may be bonded to the upper substrate so as to face each other through a bonding layer. The thin film transistor and the organic light emitting diodes are formed on the lower substrate. The lower substrate may also be provided with a flexible printed circuit board (FPCB) for driving a touchscreen panel. The flexible printed circuit board may be further provided with a timing controller for driving an array of organic light emitting diodes, a power supply, and the like.

The lower substrate may include a substrate formed of a flexible resin. For example, the lower substrate may include a flexible substrate such as a silicon substrate, a polyimide substrate, a polycarbonate substrate, and a polyacrylate substrate, etc.

In a display area of the lower substrate, plural pixel domains are defined by plural driving wires (not shown) and plural sensor wires (not shown) crossing one another, and each of the pixel domains may be formed with an array of organic light emitting diodes, each of which includes a thin film transistor and an organic light emitting diode connected to the film transistor. In a non-display area of the lower substrate, a gate driver applying electric signals to the driving wires may be formed in the form of a gate-in panel. The gate-in panel unit is formed on one or both sides of the display area.

The thin film transistor controls electric current flowing through a semiconductor by application of an electric field perpendicular to the electric current, and may be formed on the lower substrate. The thin film transistor may include a gate electrode, a gate insulation layer, a semiconductor layer, a source electrode, and a drain electrode. The thin film transistor may be an oxide thin film transistor which uses an oxide such as indium gallium zinc oxide (IGZO), ZnO, and TiO as a semiconductor layer, an organic thin film transistor which uses an organic material as a semiconductor layer, an amorphous silicon thin film transistor which uses amorphous silicon as a semiconductor layer, or a polycrystalline silicon thin film transistor which uses polycrystalline silicon as a semiconductor layer.

The planarizing layer covers the thin film transistor and a circuit section to flatten upper surfaces of the thin film transistor and the circuit section such that the organic light emitting diodes may be formed thereon. The planarizing layer may be formed of a spin-on-glass (SOG) film, a polyimide polymer, and a polyacrylic polymer, etc.

The organic light emitting diode emits light to realize a display and may be formed on the planarizing layer. The organic light emitting diode may include a first electrode, an organic light emitting layer, and a second electrode, which are stacked in order. Adjacent organic light emitting diodes may be separated by an insulation layer. The organic light emitting diode may have a bottom emission type structure wherein light generated from the organic light-emitting layer is emitted through the lower substrate, or a top-emission type structure wherein light from the organic light-emitting layer is emitted through the upper substrate.

The protective layer covers the organic light emitting diodes to protect the organic light emitting diodes. The protective layer may be formed of an inorganic insulation material such as $SiO_x$, $SiN_x$, SiC, SiON, SiONC, and amorphous carbon (a-C), or an organic insulation material such as acrylate, epoxy polymers, imide polymers, and the like.

The bonding layer bonds the lower substrate including the protective layer to the upper substrate such that the upper and lower substrates face each other. The bonding layer may be formed of a UV curable resin or heat curable resin such as (meth)acrylic, epoxy, and urethane resins. The bonding layer may further include a moisture or oxygen absorbent to protect the organic light emitting diode.

The polarizing plate 235 may realize polarization of internal light or prevent reflection of external light to realize a display, or may increase contrast of the display. The polarizing plate may be composed of a polarizer alone. Alternatively, the polarizing plate may include a polarizer and a protective film formed on one or both surfaces of the polarizer. Alternatively, the polarizing plate may include a polarizer and a protective coating layer formed on one or both surfaces of the polarizer. As the polarizer, the protective film and the protective coating layer, a general polarizer, a general protective film and a general protective coating layer may be used.

Figure 7:
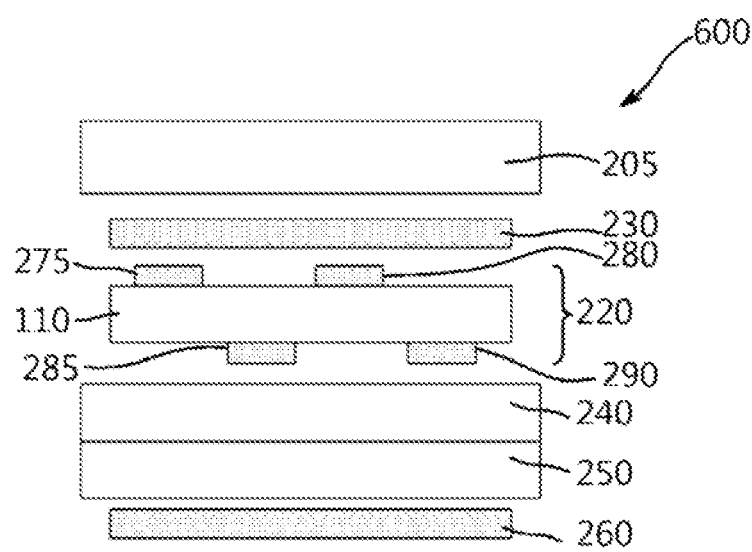
FIG. 7 illustrates a sectional view of an optical display according to an example embodiment.

Referring to FIG. 7, an optical display 600 according to an example embodiment includes: a transparent electrode structure 220 including a base layer 110, first and second electrodes 275, 280 formed on an upper surface of the base layer 110, and third and fourth electrodes 285, 290 formed on a lower surface of the base layer 110; a first polarizing plate 230 placed above the first and second electrodes 275, 280; a window layer 205 placed above the first polarizing plate; an upper substrate 240 placed below the third and fourth electrodes 285, 290; a display unit 250 formed on a lower surface of the upper substrate 240; and a second polarizing plate 260 formed on a lower surface of the display unit 250. The transparent electrode structure 220 may be formed using the transparent conductor according to embodiments.

The optical display 600 according to this embodiment is the same as the optical display 200 according to the one embodiment except that the transparent electrode structure 220 is formed above the upper substrate 240. In other embodiments, although not shown in FIG. 7, the transparent electrode structures 320; 420a, 420b of the optical display 300; 400 may be formed above the upper substrate 240, instead of the transparent electrode structure 220.

Figure 8:
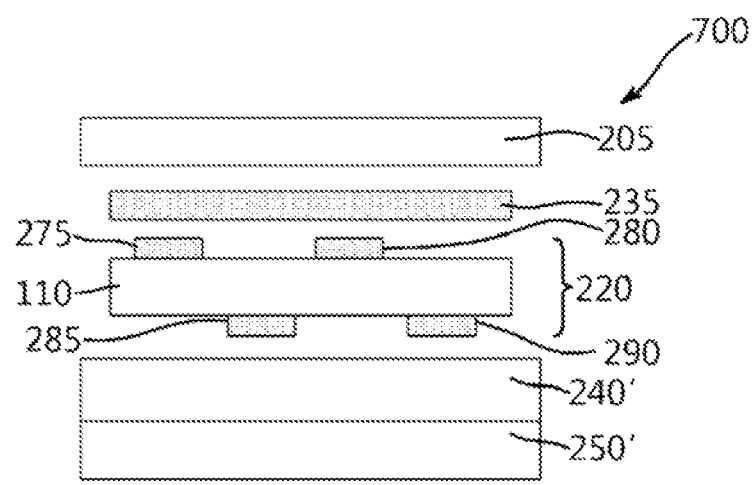
FIG. 8 illustrates a sectional view of an optical display according to an example embodiment.

Referring to FIG. 8, an optical display 700 according to an example embodiment includes: a transparent electrode structure 220 including a base layer 110, first and second electrodes 275, 280 formed on an upper surface of the base layer 110, and third and fourth electrodes 285, 290 formed on a lower surface of the base layer 110; a polarizing plate 235 placed above the first and second electrodes 275, 280; a window layer 205 placed above the polarizing plate; an upper substrate 240' placed below the third and fourth electrodes 285, 290; and a display unit 250' formed on a lower surface of the upper substrate 240'. The transparent electrode structure 220 may be formed using the transparent conductor according to embodiments.

The optical display 700 according to this embodiment is the same as the optical display 500 according to the one embodiment except that the transparent electrode structure 220 is formed above the upper substrate 240'. In other embodiments, although not shown in FIG. 8, the transparent electrode structures 320; 420a, 420b of the optical display 300; 400 may be formed above the upper substrate 240', instead of the transparent electrode structure 220.

Figure 9:
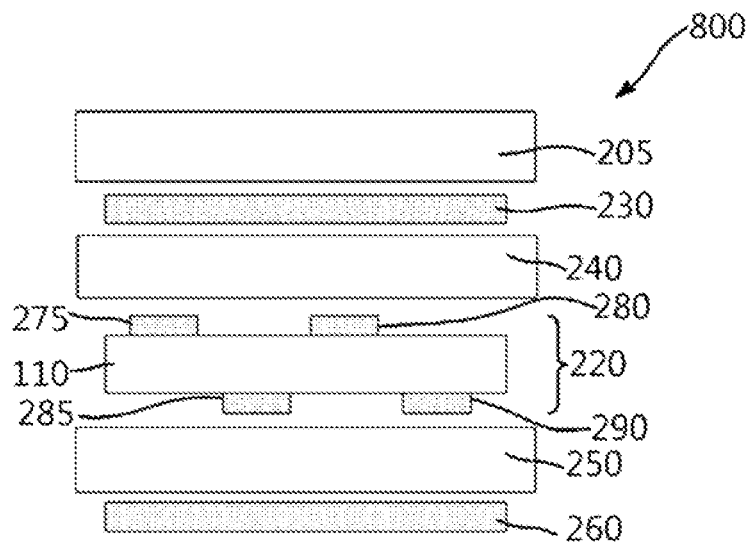
FIG. 9 illustrates a sectional view of an optical display according to an example embodiment.

Referring to FIG. 9, an optical display 800 according to an example embodiment may include: a transparent electrode structure 220 including a base layer 110, first and second electrodes 275, 280 formed on an upper surface of the base layer 110, and third and fourth electrodes 285, 290 formed on a lower surface of the base layer 110; an upper substrate 240 placed above the first and second electrodes 275, 280; a first polarizing plate 230 placed above the upper substrate 240; a window layer 205 placed above the first polarizing plate 230; a display unit 250 placed below the third and fourth electrodes 285, 290; and a second polarizing plate 260 formed on a lower surface of the display unit 250. Here, the transparent electrode structure 220 may be formed using the transparent conductor according to embodiments.

The optical display 800 according to this embodiment is the same as the optical display 200 according to the one embodiment except that the transparent electrode structure 220 is formed below the upper substrate 240. In other embodiments, although not shown in FIG. 9, the transparent electrode structures 320; 420a, 420b of the optical display 300; 400 may be formed below the upper substrate 240, instead of the transparent electrode structure 220.

Figure 10:
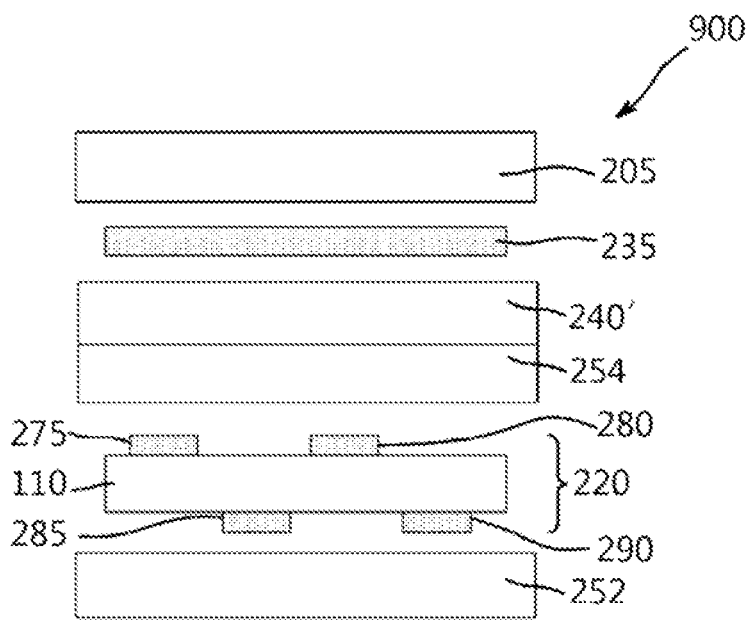
FIG. 10 illustrates a sectional view of an optical display according to an example embodiment.

Referring to FIG. 10, an optical display 900 according to an example embodiment may include: a transparent electrode structure 220 including a base layer 110, first and second electrodes 275, 280 formed on an upper surface of the base layer 110, and third and fourth electrodes 285, 290 formed on a lower surface of the base layer 110; an upper substrate 240' placed above the first and second electrodes 275, 280; a polarizing plate 235 placed above the upper substrate 240'; a window layer 205 placed above the polarizing plate 235; and a lower substrate 252 placed below the third and fourth electrodes 285, 290. Here, the transparent electrode structure 220 may be formed using the transparent conductor according to embodiments.

The optical display 900 according to this embodiment is the same as the optical display 500 according to the one embodiment except that the transparent electrode structure 220 is formed below the upper substrate 240'. In other embodiments, although not shown in FIG. 10, the transparent electrode structures 320; 420a, 420b of the optical display 300; 400 may be formed below the upper substrate 240', instead of the transparent electrode structure 220.

The lower substrate 252 serves to support the display unit and may be formed with a thin film transistor thereon.

In one embodiment, an organic light emitting diode 254 may be disposed between the upper substrate 240' and the transparent electrode structure 220. Here, the organic light emitting diode 254 may be formed on a lower surface of the upper substrate 240'.

Although the organic light emitting diode 254 is illustrated as being formed on the lower surface of the upper substrate 240' in FIG. 10, the organic light emitting diode 254 may also be formed together with the thin film transistor on the lower substrate 252.

In addition, although not shown in FIG. 3 to FIG. 10, a first base layer, a second base layer or the base layer may be provided in a stack structure in which a resin film is stacked by adhesives and the like.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Example 1

50 parts by weight of a metal nanowire-containing solution (ClearOhm Ink, Cambrios Co., Ltd.) was added to 50 parts by weight of ultrapure distilled water, followed by stirring, thereby preparing a composition for a transparent conductive layer.

2 parts by weight of a hollow silica-containing solution (TU-2286, containing an acrylate resin and a fluorine resin, JSR Co., Ltd.), 0.05 parts by weight of Y-300 (anthraquinone dye, Yabang Co., Ltd., China) and 0.05 parts by weight of Y-82 (anthraquinone dye, Yabang Co., Ltd., China) were mixed with 98 parts by weight of propylene glycol monomethyl ether, thereby preparing a composition for a low refractive index layer.

A titanium oxide-containing solution (TYT 90-1, Pelnox Co., Ltd.) was coated onto a double sided hard-coated polyethylene terephthalate film (100 CPB, KIMOTO Co., Ltd.) using a spin coater, dried in an oven at 80° C. for 2 minutes and at 140° C. for 2 minutes, and cured through UV irradiation at 500 mJ/cm$^2$ to form a high refractive index coating layer.

Next, the composition for a transparent conductive layer was coated onto the high refractive index coating layer using a spin coater, followed by drying in an oven at 80° C. for 2 minutes to form a transparent conductive layer. Then, the composition for a low refractive index layer was coated onto the transparent conductive layer using a spin coater, dried in an oven at 80° C. for 2 minutes and at 140° C. for 2 minutes, and cured through UV irradiation at 500 mJ/cm$^2$ to form a high refractive index coating layer, thereby preparing a transparent conductor.

Examples 2 to 4

Transparent conductors were prepared in the same manner as in Example 1 except that the thickness of each of the high refractive index coating layer, the transparent conductive layer, and the low refractive index coating layer was changed.

Comparative Example 1

A transparent conductor was prepared in the same manner as in Example 1 except that a high refractive index layer was not formed.

Comparative Example 2

A transparent conductor was prepared in the same manner as in Example 1 except that a low refractive index layer was not formed.

Comparative Example 3

A transparent conductor was prepared in the same manner as in Example 1 except that a low refractive index layer was formed without using dyes.

Comparative Example 4

A transparent conductor was prepared in the same manner as in Example 1 except that a transparent conductive layer, a high refractive index layer, and a low refractive index layer were sequentially formed on a base film.

sheet resistance meter (R-CHEK RC2175, EDTM Co., Ltd.) by measuring 4-probe contact resistance.

(4) Reflective b*: Reflective b* of each transparent conductor was measured at room temperature through irradiation with visible light at a wavelength of 380 nm to 780 nm using a colorimeter (CM3600D, CIE Lab., Konica Minolta Co., Ltd.) in accordance with DIN5033 Tei7, JIS Z 8722 (Condition c), ISO7724/1, CIE No. 15, or ASTM E1164.

(5) Transmittance x and transmittance y: Transmittance x and transmittance y of each transparent conductor were measured at room temperature through irradiation with visible light at a wavelength of 380 nm to 780 nm using a

TABLE 1

| | Thickness of high refractive index layer | Thickness of low refractive index layer | Dye content of low refractive index layer | Thickness of transparent conductive layer | Remarks |
|---|---|---|---|---|---|
| Example 1 | 40~50 nm | 50~60 nm | 0.1 wt % | 100~150 nm | base film/high refractive index layer/transparent conductive layer/low refractive index layer |
| Example 2 | 40~50 nm | 80~90 nm | 0.1 wt % | 100~150 nm | base film/high refractive index layer/transparent conductive layer/low refractive index layer |
| Example 3 | 70~80 nm | 50~60 nm | 0.1 wt % | 100~150 nm | base film/high refractive index layer/transparent conductive layer/low refractive index layer |
| Example 4 | 70~80 nm | 80~90 nm | 0.1 wt % | 100~150 nm | base film/high refractive index layer/transparent conductive layer/low refractive index layer |
| Comparative Example 1 | — | 50~60 nm | 0.1 wt % | 100~150 nm | base film/transparent conductive layer/low refractive index layer |
| Comparative Example 2 | 40~50 nm | — | — | 100~150 nm | base film/high refractive index layer/transparent conductive layer |
| Comparative Example 3 | 40~50 nm | 50~60 nm | — | 100~150 nm | base film/high refractive index layer/transparent conductive layer/low refractive index layer |
| Comparative Example 4 | 40~50 nm | 50~60 nm | 0.1 wt % | 100~150 nm | base film/transparent conductive layer/high refractive index layer/low refractive index layer |

Each of the transparent conductors prepared in Examples and Comparative Examples was evaluated as to the following properties. Results are shown in Table 2.

(1) Haze: With the transparent conductive layer of each transparent conductor placed to face a light source, a haze value of the transparent conductor was measured at a wavelength of 400 nm to 700 nm using a haze meter (NDH-9000).

(2) Total diffuse reflectance (Total DR): Total DL of each transparent conductor was calculated as a total diffuse reflectance value at a wavelength of about 380 nm to about 780 nm after measuring diffuse reflectance values in the overall wavelength range using a UV spectrometer (Perkin Elmer Lambda 1050).

(3) Sheet resistance ($\Omega/\square$): Sheet resistance of each transparent conductor was measured using a contact type colorimeter (CM3600D, CIE Lab., Konica Minolta Co., Ltd.) in accordance with DIN5033 Tei7, JIS Z 8722 (Condition c), ISO7724/1, CIE No. 15, or ASTM E1164.

(6) Pattern visibility: A transparent conductive layer and an overcoating layer of each transparent conductor were patterned by etching. The transparent conductor was rated as "Poor" when patterned and non-patterned portions of the transparent conductive layer and the overcoating layer were visible to the naked eye, as "Improved" when a difference between the patterned and non-patterned portions was slightly visible to the naked eye, and as "Good" when the presence or absence of the pattern was identified only through detailed observation of the patterned and non-patterned portions with the naked eye.

TABLE 2

| | Haze (%) | Total DR (Integral DR) (%) | Sheet resistance (Ω/□) | Reflective b* | Transmittance x value | Transmittance y value | Pattern visibility |
|---|---|---|---|---|---|---|---|
| Example 1 | 1.06 | 275 | 60~70 | −0.26 | 0.31 | 0.33 | Improved |
| Example 2 | 1.10 | 283 | 60~70 | 0.29 | 0.32 | 0.34 | Improved |
| Example 3 | 1.09 | 291 | 60~70 | −1.26 | 0.31 | 0.34 | Good |
| Example 4 | 1.14 | 306 | 60~70 | −1.10 | 0.31 | 0.34 | Good |
| Comparative Example 1 | 1.12 | 340 | 60~70 | 2.75 | 0.31 | 0.33 | Poor |
| Comparative Example 2 | 1.25 | 355 | 60~70 | 2.55 | 0.31 | 0.33 | Poor |
| Comparative Example 3 | 1.07 | 330 | 60~70 | 2.39 | 0.32 | 0.34 | Poor |
| Comparative Example 4 | 1.09 | 304 | 80~100 | 1.04 | 0.31 | 0.34 | Poor |

As shown in Table 1, it may be seen that the transparent conductor according to the Examples had high transmittance and low haze, which may provide good optical characteristics, and prevent the pattern from being observed upon patterning.

In Comparative Example 1 wherein the high refractive index layer was not formed, and in Comparative Example 2 wherein the low refractive index layer was not formed, the transparent conductors exhibited milkiness and pattern visibility due to reflection. In Comparative Example 3 wherein the dyes were not used, the transparent conductor exhibited milkiness, and in Comparative Example 4 wherein the transparent conductive layer, the high refractive index layer and the low refractive index layer were sequentially formed, the transparent conductor had an increase in sheet resistance or chargeability and pattern visibility.

By way of summation and review, a transparent conductor may include silver nanowires. Although a transparent conductor including the silver nanowires may exhibit excellent conductive and flexural properties, the silver nanowires may cause scattering of light upon irradiation of the transparent conductor such that the transparent conductor looks milky due to inherent colors of the metal nanowires (milkiness phenomenon). As a result, a pattern may be visible upon patterning of the transparent conductor. It is desirable for a transparent conductor to have low sheet resistance with minimal pattern visibility.

As described above, a transparent conductor according to one or more embodiments may reduce or eliminate pattern visibility while having low sheet resistance. One or more embodiments may provide a transparent conductor that reduces or eliminates milkiness and looks transparent while having low sheet resistance and a general color value.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. A transparent conductor, comprising:
   a base layer;
   a high refractive index coating layer on the base layer;
   a transparent conductive layer on the high refractive index coating layer; and
   a low refractive index coating layer on the transparent conductive layer, wherein:
   the transparent conductive layer includes metal nanowires,
   the low refractive index coating layer includes a mixture of a first dye having a maximum absorption wavelength of about 450 nm to about 550 nm and a second dye having a maximum absorption wavelength of about 350 nm to about 449 nm, and
   the transparent conductor has a total diffuse reflection (DR) of greater than or equal to about 80% and less than 330% at a wavelength of about 380 nm to about 780 nm and a reflective b* value from about −2 to about 1 at a wavelength of about 380 nm to about 780 nm.

2. The transparent conductor as claimed in claim 1, wherein the metal nanowires include silver nanowires.

3. The transparent conductor as claimed in claim 1, wherein the high refractive index coating layer has an index of refraction of about 1.7 to about 1.9.

4. The transparent conductor as claimed in claim 1, wherein the high refractive index coating layer has a thickness of about 40 nm to about 100 nm.

5. The transparent conductor as claimed in claim 1, wherein the high refractive index coating layer includes titanium oxide, zirconium oxide, silicon oxide, or a combination thereof.

6. The transparent conductor as claimed in claim 1, wherein the low refractive index coating layer has an index of refraction of about 1.3 to about 1.38.

7. The transparent conductor as claimed in claim 1, wherein the low refractive index coating layer has a thickness of about 50 nm to about 150 nm.

8. The transparent conductor as claimed in claim 1, wherein the low refractive index coating layer includes inorganic particles having an index of refraction of about 1.30 to about 1.38.

9. The transparent conductor as claimed in claim 8, wherein the inorganic particles include hollow silica particles, porous silica particles, or a combination thereof.

10. The transparent conductor as claimed in claim 8, wherein at least one of the first dye and second dye includes an anthraquinone dye.

11. The transparent conductor as claimed in claim 1, wherein the transparent conductive layer has a thickness of about 100 nm to about 150 nm.

12. The transparent conductor as claimed in claim 1, wherein the transparent conductor has a transmittance x value of about 0.3 to about 0.4 and a transmittance y value of about 0.3 to about 0.4 at a wavelength of about 380 nm to about 780 nm.

13. An optical display comprising the transparent conductor as claimed in claim 1.

* * * * *